(12) United States Patent
Lu et al.

(10) Patent No.: US 11,343,924 B2
(45) Date of Patent: May 24, 2022

(54) UNMANNED AERIAL VEHICLE AND AVIONICS SYSTEM THEREOF

(71) Applicant: SZ DJI TECHNOLOGY CO., LTD., Shenzhen (CN)

(72) Inventors: Chuoying Lu, Shenzhen (CN); Lei Deng, Shenzhen (CN); Xiaolong Wu, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/881,985

(22) Filed: May 22, 2020

(65) Prior Publication Data

US 2020/0288586 A1 Sep. 10, 2020

Related U.S. Application Data

(63) Continuation of application No. PCT/CN2017/112776, filed on Nov. 24, 2017.

(51) Int. Cl.
*H05K 5/02* (2006.01)
*H05K 7/20* (2006.01)
*H05K 5/03* (2006.01)
*B64C 39/02* (2006.01)
*B64D 47/08* (2006.01)
(Continued)

(52) U.S. Cl.
CPC ......... *H05K 5/0026* (2013.01); *B64C 39/024* (2013.01); *B64D 47/02* (2013.01); *B64D 47/08* (2013.01); *H04N 5/2252* (2013.01); *H04N 5/2253* (2013.01); *H05K 5/0247* (2013.01); *H05K 5/03* (2013.01); *H05K 7/20172* (2013.01)

(58) Field of Classification Search
CPC ...... H05K 5/0026; H05K 5/0247; H05K 5/03; H05K 7/20172; B64C 39/024; B64C 2201/145; B64C 2201/127; B64D 47/02; B64D 47/08; B64D 47/00; H04N 5/2252; H04N 5/2253; G03B 15/006
USPC .......................................................... 348/144
See application file for complete search history.

(56) References Cited

U.S. PATENT DOCUMENTS 9,581,999 B2 * 2/2017 Zhou ................... G06K 9/00637
9,616,998 B2 * 4/2017 Oakley ................. B64C 39/024
(Continued)

FOREIGN PATENT DOCUMENTS

CN 204383757 U 6/2015
CN 204731643 U 10/2015
(Continued)

OTHER PUBLICATIONS

The World Intellectual Property Organization (WIPO) International Search Report for PCT/CN2017/112776 dated Aug. 24, 2018 6 pages.

*Primary Examiner* — Susan E. Hodges
(74) *Attorney, Agent, or Firm* — Anova Law Group, PLLC

(57) ABSTRACT

An avionics system for an unmanned aerial vehicle (UAV) includes a housing having a mounting hole, a flight control circuit board arranged inside the housing, a wireless communication circuit board integrated with the flight control circuit board on a printed circuit board (PCB), a positioning circuit arranged inside the housing and above or below the PCB, and a connection wire passing through the mounting hole and connecting the flight control circuit board with an electronic governor of the UAV arranged outside the housing.

16 Claims, 6 Drawing Sheets

(51) Int. Cl.
*B64D 47/02* (2006.01)
*H04N 5/225* (2006.01)
*H05K 5/00* (2006.01)

(56) References Cited

U.S. PATENT DOCUMENTS

| | | | |
|---|---|---|---|
| 2015/0327402 A1* | 11/2015 | Slippey | H05K 7/20318 |
| | | | 361/714 |
| 2016/0096622 A1 | 4/2016 | Richardson | |
| 2017/0129603 A1* | 5/2017 | Raptopoulos | G08G 5/0069 |
| 2017/0183074 A1* | 6/2017 | Hutson | B64C 1/061 |
| 2017/0193830 A1* | 7/2017 | Fragoso | G05D 1/102 |
| 2017/0212529 A1* | 7/2017 | Kumar | G01C 21/20 |
| 2019/0098433 A1* | 3/2019 | Shaw | G05D 1/0022 |
| 2019/0349529 A1* | 11/2019 | Achtelik | F16M 11/123 |

FOREIGN PATENT DOCUMENTS

| | | |
|---|---|---|
| CN | 106715269 A | 5/2017 |
| CN | 106741891 A | 5/2017 |
| CN | 206155792 U | 5/2017 |
| CN | 107074341 A | 8/2017 |
| CN | 206394889 U | 8/2017 |
| CN | 206410888 U | 8/2017 |
| CN | 206547215 U | 10/2017 |
| GB | 808559 A | 2/1959 |

* cited by examiner

UNMANNED AERIAL VEHICLE AND AVIONICS SYSTEM THEREOF

CROSS-REFERENCE TO RELATED APPLICATION

This application is a continuation of International Application No. PCT/CN2017/112776, filed on Nov. 24, 2017, the entire content of which is incorporated herein by reference.

TECHNICAL FIELD

The present disclosure relates to the technical field of aircraft and, more particularly, to an unmanned aerial vehicle (UAV) and an avionics system thereof.

BACKGROUND

An unmanned aerial vehicle (UAV) is a type of a driverless flying apparatus. The UAV is fast, flexible, and easy to operate. A body of the UAV generally carries multiple sensors, such that the real-time image transmission, terrain and landform detection, pest and disease monitoring, monitoring of forest fire danger, and the like, can be realized. With the development of technology, the applications of the UAV have gradually expanded from the military and scientific research fields to various fields, such as power, communication, meteorology, agriculture, marine, exploration, photography, disaster prevention and mitigation, crop production estimation, drug and anti-smuggling, border patrol, public security and anti-terrorism field, and the like.

An avionics system of the UAV is one of the core components of the UAV. The avionics system of the UAV can control the UAV and monitor the surrounding environment. The avionics system of the UAV generally includes various electronic components, for example, a flight control circuit board, a wireless communication circuit board, various sensors, and the like. These electronic components are scattered inside a rack of the UAV. The scattered components cause the UAV to be bulky and seriously affect an expansion of UAV functions. Therefore, the researchers integrated some of these electronic components together to reduce the size of the UAV, however, these integrated electronic components interfere with each other in actual working state. As a result, there is a large noise in a control signal of the UAV, which causes the subsequent filtering work more difficult. Although a large number of noise filters have been processed, some noises still cannot be completely eliminated, thereby posing a potential threat to the UAV's flight safety.

SUMMARY

In accordance with the disclosure, there is provided an avionics system for an unmanned aerial vehicle (UAV) including a housing having a mounting hole, a flight control circuit board arranged inside the housing, a wireless communication circuit board integrated with the flight control circuit board on a printed circuit board (PCB), a positioning circuit arranged inside the housing and above or below the PCB, and a connection wire passing through the mounting hole and connecting the flight control circuit board with an electronic governor of the UAV arranged outside the housing.

BRIEF DESCRIPTION OF THE DRAWINGS

In order to provide a clearer illustration of objective and technical solutions of disclosed embodiments, the drawings used in the description of the disclosed embodiments are briefly described below. It will be appreciated that the disclosed drawings are merely examples and not intended to limit the disclosure.

Figure 1:
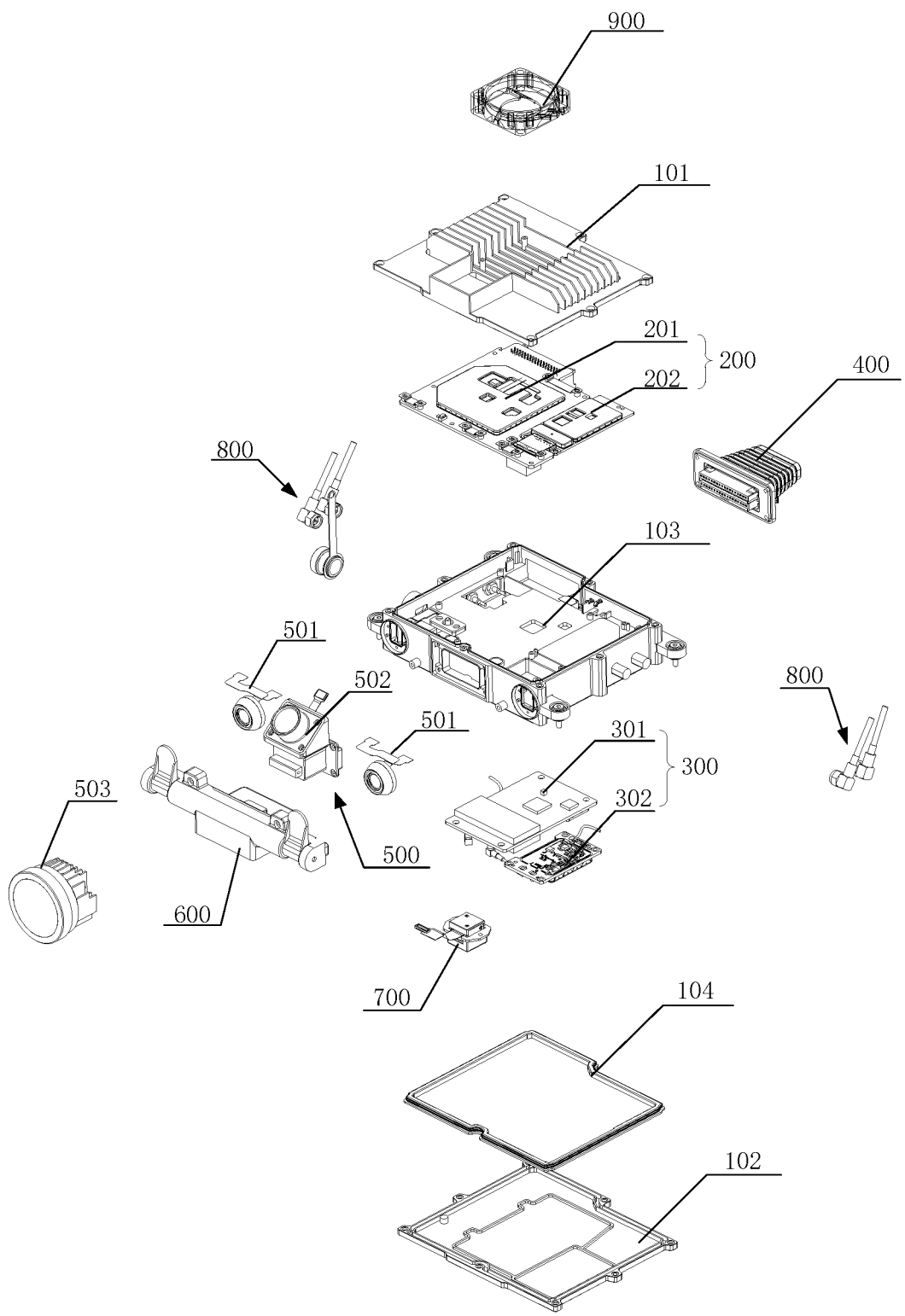
FIG. 1 is an exploded view of an avionics system of an unmanned aerial vehicle (UAV) consistent with embodiments of the disclosure.

| Description of Reference Numerals | |
|---|---|
| 101 Upper cover | 102 Lower cover |
| 103 Middle frame | 104 Sealing ring |
| 200 PCB | 201 Flight control circuit board |
| 202 Wireless communication circuit board | 300 Positioning circuit |
| 301 RTK positioning circuit | 302 GPS positioning circuit |
| 400 Connection wire | 500 Visual sensing apparatus |
| 501 Binocular camera | 502 Image transmission circuit |
| 503 Indicator light | 600 Binocular camera mounting bracket |
| 700 Inertial sensing circuit | 800 Antenna |
| 900 Fan | 1 Rack |
| 10 Avionics system | 2 Arm |
| 3 Power component | 31 Electronic governor |
| 32 Motor | 33 Propeller |

DETAILED DESCRIPTION OF THE EMBODIMENTS

Hereinafter, example embodiments will be described with reference to the accompanying drawings. Unless conflicted, the features of the following embodiments and implementations can be combined with each other.

Figure 2:
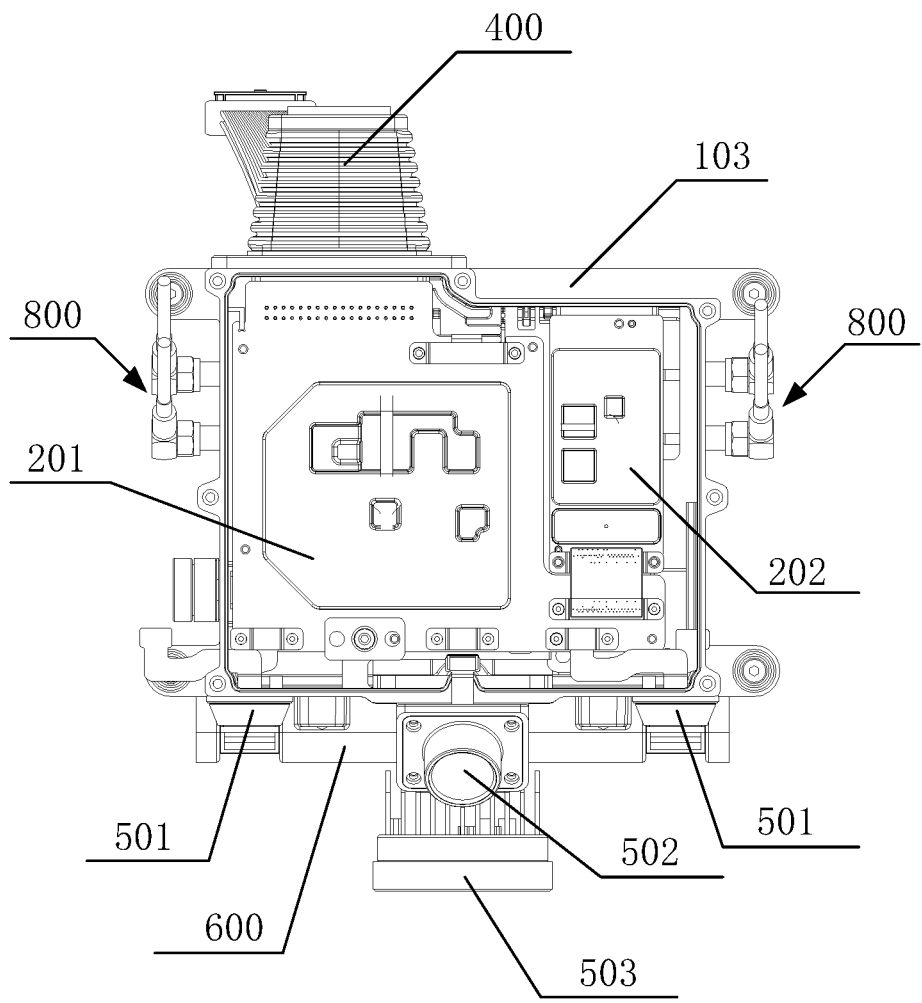
FIG. 2 is a top view of the avionics system of FIG. 1 with an upper cover being removed consistent with embodiments of the disclosure.
Figure 3:
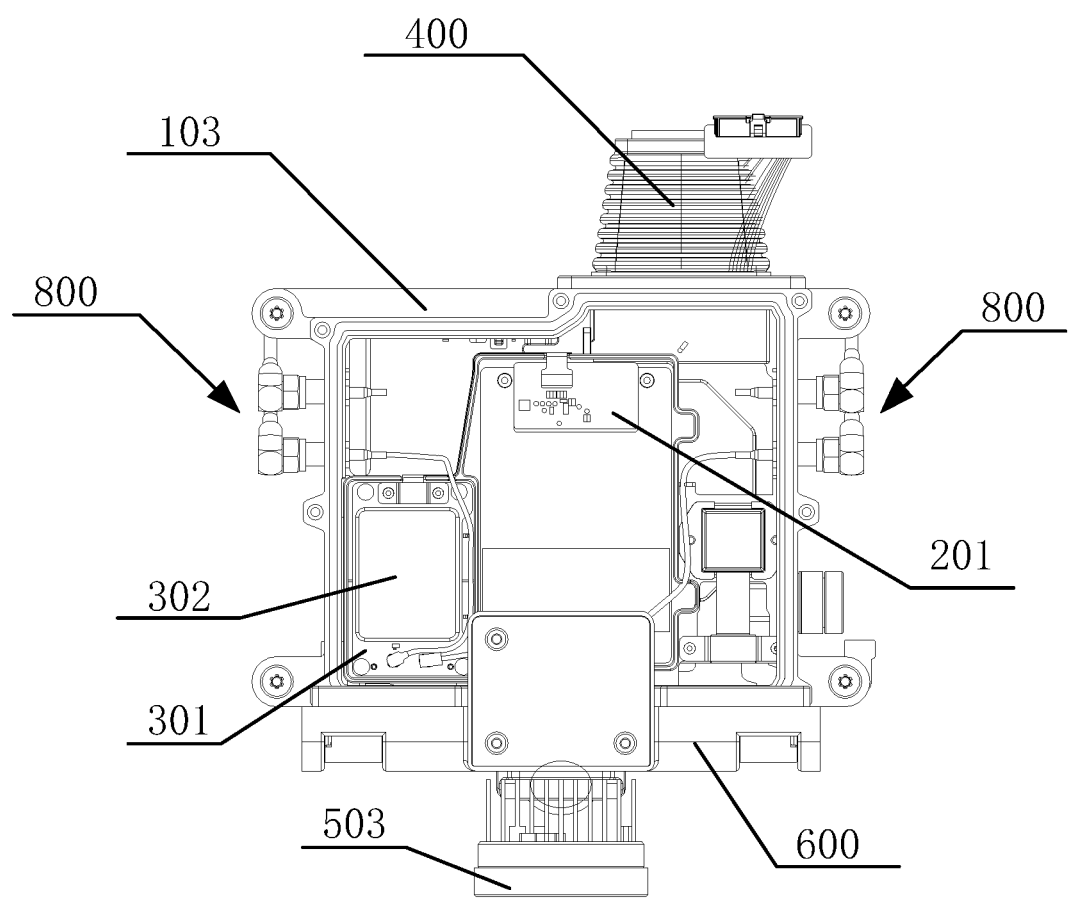
FIG. 3 is a bottom view of the avionics system of FIG. 1 with a lower cover being removed consistent with embodiments of the disclosure.
Figure 4:
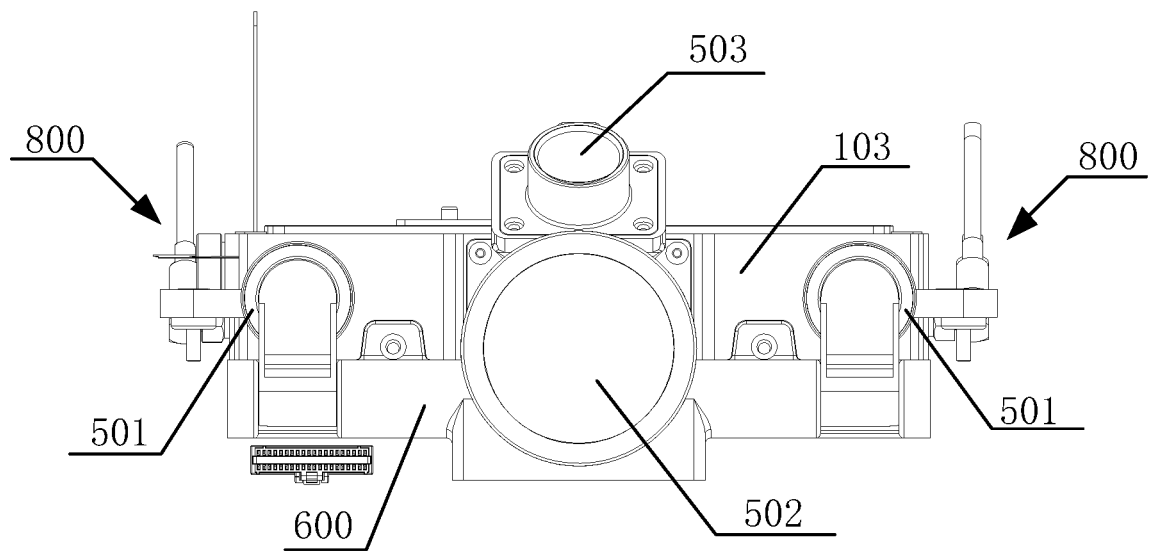
FIG. 4 is a front view of the avionics system of FIG. 1 consistent with embodiments of the disclosure.
Figure 5:
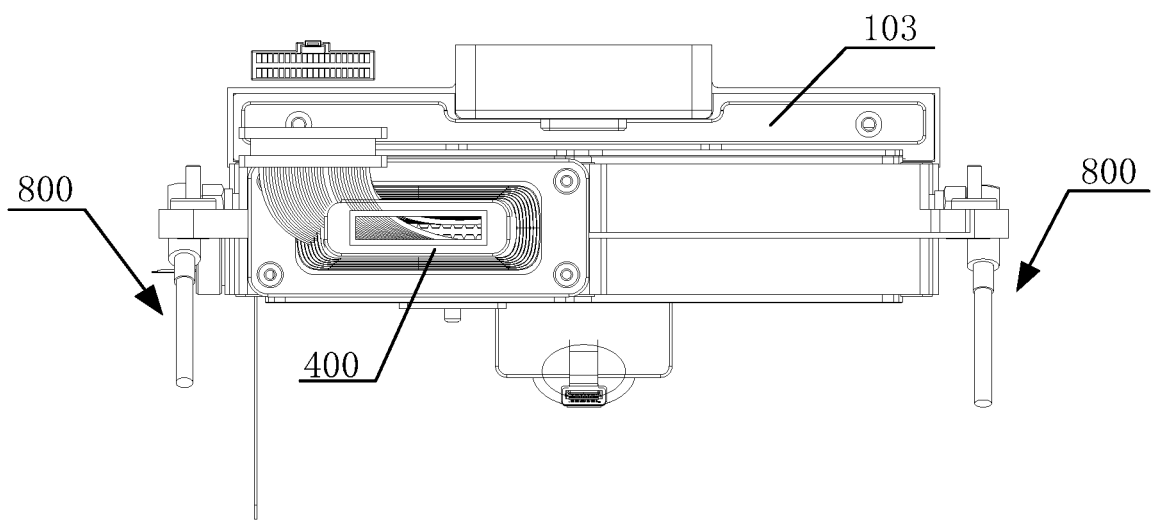
FIG. 5 is rear view of the avionics system of FIG. 1 consistent with embodiments of the disclosure.
Figure 6:
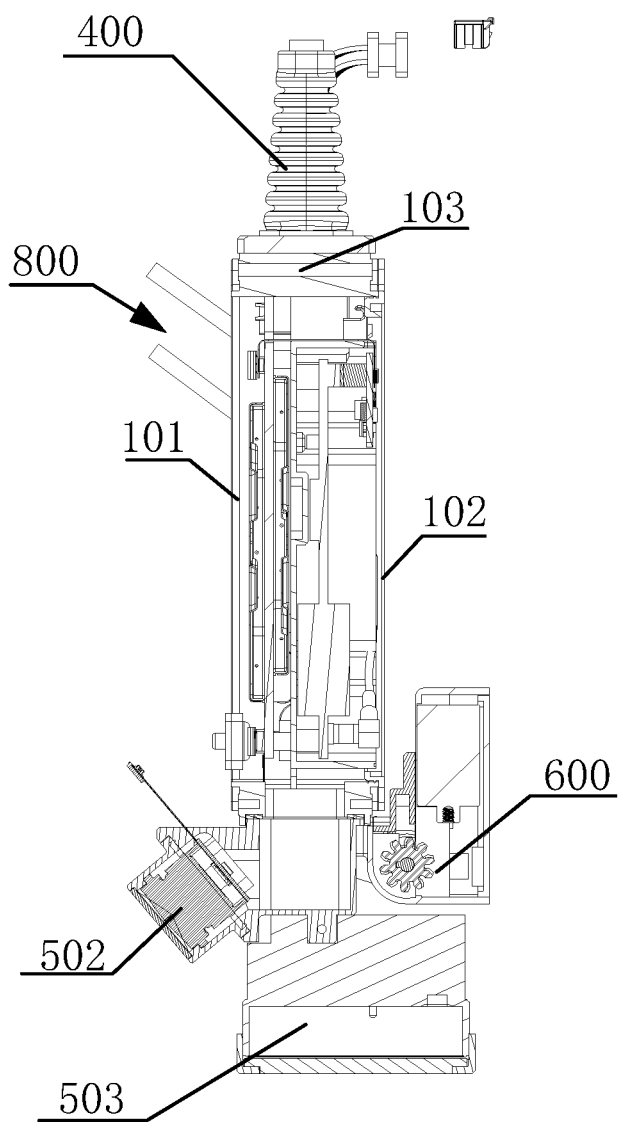
FIG. 6 is a cross-sectional view of the avionics system of FIG. 1 consistent with embodiments of the disclosure.

FIG. 1 is an exploded view of an avionics system of an unmanned aerial vehicle (UAV) consistent with the disclosure. FIG. 2 is a top view of the avionics system of FIG. 1 with an upper cover being removed. FIG. 3 is a bottom view of the avionics system of FIG. 1 with a lower cover being removed. FIG. 4 is a front view of the avionics system of FIG. 1 consistent with the disclosure. FIG. 5 is rear view of the avionics system of FIG. 1 consistent with the disclosure. FIG. 6 is a cross-sectional view of the avionics system of FIG. 1 consistent with the disclosure.

As shown in FIGS. 1 to 6, the avionics system includes a housing, a flight control circuit board 201, a wireless communication circuit board 202, a positioning circuit 300, and a connection wire 400. The avionics system of the UAV can control a flight of the UAV. For example, the avionics system of the UAV can control a working state of an electronic governor of the UAV, thereby controlling an output of a motor of the UAV to control a rotation of a propeller of the UAV, so as to control lifting off, landing, diving, steering, and the like, of the UAV. The avionics system of the UAV can also control sensors arranged at the UAV to obtain information about a surrounding environment such as image, location, altitude, and the like.

The avionics system of the UAV can be arranged outside or inside a body of the UAV. The avionics system of the UAV can also be arranged at a top, bottom, nose, tail or any side of the body of the UAV. In some embodiments, the avionics system of the UAV can be arranged outside of the body and located at the nose of the UAV to carry a front vision module of the UAV, such as a visual sensing apparatus 500.

An enclosed space can be formed in the housing for mounting the flight control circuit board 201, the wireless communication circuit board 202, e.g., a Software Definition Radio (SDR), and the positioning circuit 300. The flight control circuit board 201 and the wireless communication circuit board 202 can be integrated on a printed circuit board (PCB) 200, and the positioning circuit 300 can be arranged above or below the PCB 200. In some embodiments, the housing may be made of metal, plastic, or other materials and into a rectangular, cylindrical, or another shape.

For example, the housing may include an upper housing and a lower housing. Side walls of the upper housing and the lower housing can be fixed together by means of snapping or bolting, such that the enclosed space for mounting the PCB 200 and the positioning circuit 300 can be formed by the upper housing and the lower housing.

The PCB 200 and the positioning circuit 300 can be fixed on an inner wall of the enclosed space by using the bolts. In some embodiments, the upper housing and the lower housing may form a plurality of mounting areas on the inner wall by means of punching or injection molding, and the PCB 200 and the positioning circuit 300 can be fixed at different mounting areas. For example, each of the PCB 200 and the positioning circuit 300 can be arranged at the mounting area whose appearance and shape match its appearance and shape.

A mounting hole can be provided on a side wall of the upper housing, or on a side wall of the lower housing, or at a connection portion between the upper housing and the lower housing. The connection wire 400 connecting the PCB 200 and the electronic governor can pass through the mounting hole. In some embodiments, the connection wire 400 can include a pin plug or a pin socket. The corresponding pin socket or pin plug corresponding to the pin plug or the pin socket on the connection wire 400 can be provided on the PCB 200.

A seal ring 104 can be provided at the connection portion between the upper housing and the lower housing to improve a tightness of the housing, thereby preventing dust or liquid from entering the housing, and improving a service life and stability of the avionics system of the UAV.

Consistent with the disclosure, in the avionics system of the UAV, the flight control circuit board 201 and the wireless communication circuit board 202 can be integrated on the PCB 200, the PCB 200 and the positioning circuit 300 can be mounted inside the housing, and the connection wire 400 for connecting the flight control circuit board 201 and the electronic governor can pass through the mounting hole provided on the side wall of the housing. As such, the electronic governor, motor, and propeller can be isolated from the flight control circuit board 201, the wireless communication circuit board 202, and the positioning circuit 300, and thus, when a power component is working, a generated magnetic field change signal cannot be superimposed on the avionics system of the UAV. Therefore, a difficulty of subsequent filtering can be reduced, an information transmission reliability of the avionics system of the UAV can be improved, the performance of the UAV can be stabled, and the potential safety threat of the UAV can be reduced.

Furthermore, because the power component can be communicatively connected to the avionics system of the UAV through the connection wire 400, weak electrical components and strong electrical components of the UAV can be isolated, thereby reducing conversions between the strong and weak powers and the number of isolation components of the avionics system. As a result, the amount of wiring harness of the avionics system of the UAV can be reduced, the wiring of the avionics system can become simple and easy, and the size of the avionics system of the UAV can be reduced. Manufacturing assembly, maintenance, or testing of the avionic system can be more convenient and simpler. The interference of complex lines on signal transmission can be reduced, the stability of the UAV can be improved, and the potential safety threat of the UAV can be reduced. A heat dissipation of the avionics system of the UAV can be also greatly reduced, such that the electronic components in the avionics system of the UAV can work withing a rated operating temperature, thereby improving the stability of the avionics system of the UAV.

In some embodiments, for example, as shown in FIG. 1, the housing can include a main body and an upper cover 101. The main body can include a bottom wall and a side wall along an outer edge of the bottom wall. The upper cover 101 can cover at an upper opening of the main body and can be fixed to the side wall of the main body by means of bolts or snap-fit connection, such that the enclosed space for mounting the PCB 200 and the positioning circuit 300 can be formed by the upper cover 101 and the main body.

The PCB 200 and the positioning circuit 300 can be fixed on the inner wall of the main body by bolts. In some embodiments, a plurality of mounting areas can be formed on the bottom wall of the main body by punching or injection molding. The PCB 200 can be mounted at one of the mounting areas, and the positioning circuit 300 can be mounted at another mounting area. In some embodiments, the positioning circuit 300 and the PCB 200 can be arranged in the same mounting area. For example, the PCB 200 and the positioning circuit 300 may be stacked on top of each other or may be arranged on the left and right parts of the same mounting area. When the bottom wall of the main body is punched or injection-molded, the corresponding punching or injection-molding operations can be performed according to the appearance shapes of the PCB 200 and the positioning circuit 300, such that the enclosed space of the housing can be used reasonably and efficiently.

A mounting hole can be provided at the side wall of the main body, and the connection wire 400 (for example, a bus) for communicating with the electronic governor can be connected to the flight control circuit board 201 through the mounting hole. In some embodiments, the connection wire 400 can include the pin plug or the pin socket. A corresponding pin socket or pin plug corresponding to the pin plug or the pin socket on the connection wire 400 can be provided at the PCB 200.

A sealing ring 104 can be provided between the side wall of the main body and the upper cover 101 to improve the tightness of the housing, to prevent water or dust from entering the enclosed space of the housing, and to improve the service life of electronic devices, for example, the PCB 200 and the positioning circuit 300 in the housing. For example, a groove for mounting the seal ring 104 may be opened at an opening of the main body or a lower surface of the upper cover 101.

Consistent with the disclosure, the housing of the avionics system of the UAV can include the upper cover 101 and the main body, such that water and dust cannot easily enter the avionics system of the UAV from the sides of the avionics system, thereby improving the tightness of the avionics system of the UAV.

In some embodiments, for example, as shown in FIG. 1, the housing includes the upper cover 101, a middle frame 103, and a lower cover 102. The upper cover 101 can cover an upper opening of the middle frame 103 and fixed together by means of bolts or snap-fits, such that the upper cover 101 and the middle frame 103 can enclose to form an upper enclosed space. Similarly, the lower cover 102 can cover a lower opening of the middle frame 103 and fixed together by means of bolts or snap-fits, such that the lower cover 102 and the middle frame 103 can enclose to form a lower enclosed space. During assembly, the PCB 200 may be arranged in the upper enclosed space, and the positioning circuit 300 may be arranged in the lower enclosed space. The PCB 200 and the positioning circuit 300 can be communicatively connected through a wire harness. For example, in order to mount the wire harness connecting the PCB 200 and the positioning circuit 300, a through hole may be provided in the middle frame 103 for the wire harness to pass through.

The middle frame 103 can include a mounting plate and a side wall along an outer edge of the mounting plate. A plurality of mounting areas can be formed on the mounting plate by punching or injection molding. Some of these mounting areas can be located on the upper surface of the mounting plate and others can be located on the lower surface of the mounting plate. For example, when mounting the PCB 200 and the positioning circuit 300, the PCB 200 may be fixed at the mounting area above the mounting board by bolts, and the positioning module 300 may be fixed at the mounting area below the mounting board by bolts. The mounting areas can be set to match the appearance shapes of the PCB 200 and the positioning circuit 300, thereby reducing the size of the housing.

A mounting hole is provided on the side wall of the middle frame 103, and the connection wire 400 (e.g., a bus) for communicating with the electronic governor can be connected to the flight control circuit board 201 through the mounting hole. In some embodiments, the connection wire 400 can include the pin plug or the pin socket. The corresponding pin socket or pin plug corresponding to the pin plug or the pin socket on the connection wire 400 can be provided on the PCB 200.

Two sealing rings 104 may be provided at a connection portion between the upper cover 101 and the middle frame 103 and a connection portion between the lower cover 102 and the middle frame 103 to improve the tightness of the housing, to prevent water or dust from entering the enclosed space of the housing, and to improve the service life of electronic devices such as the PCB 200 and the positioning circuit 300 in the housing. For example, two grooves for mounting the two seal rings 104 may be provided at the connection portion between the upper cover 101 and the connection portion between the lower cover 102 and the middle frame 103.

Consistent with the disclosure, the housing of the avionics system of the UAV can include the upper cover 101, the lower cover 102, and the middle frame 103, such that the enclosed space can be divided into upper and lower enclosed space, thereby avoiding electronic components stacked on the same surface, thereby reducing the size of the avionics system of the UAV and improving the heat dissipation performance of the avionics system.

In some embodiments, a front wall of the housing is fixed with a visual sensing apparatus 500. As shown in FIGS. 1 to 4, the housing includes the front wall facing a forward direction of the UAV, a rear wall facing away from the front wall, and a left wall and a right wall connecting the front wall and the rear wall. Taking the housing structure illustrated in FIG. 1 as an example, the middle frame 103 includes the front wall, the rear wall, the left wall, and the right wall.

The visual sensing apparatus 500 can be fixed on the front wall of the housing. For example, a mounting hole can be provided at the front wall, and the visual sensing apparatus 500 can be fixed at the mounting hole. A connector of the visual sensing apparatus 500 can be electrically connected to an interface of the flight control circuit board 201 through the mounting hole to realize the signal transmission between the visual sensing apparatus 500 and the flight control circuit board 201.

In some embodiments, the visual sensing apparatus 500 can include a binocular camera 501 and an image transmission circuit 502, e.g., a first-person view (FPV). Two lenses of the binocular camera 501 can be arranged on two sides of the image transmission circuit 502, and an indicator light 503 can be provided in a front end of the image transmission circuit 502 and configured to indicate a working state of the image transmission circuit. As shown in FIG. 2, the image transmission circuit 502 is fixed in the middle of the front wall of the middle frame 103, and the two lenses of the binocular camera 501 are arranged on the left and right sides of the image transmission circuit 502.

In some embodiments, as shown in FIGS. 1 and 2, a binocular mounting bracket 600 is provided at a front end of the middle frame 103, and the binocular mounting bracket 600 can be configured to carry the visual sensing apparatus 500.

In some embodiments, a mounting hole for the connection wire 400 can be provided at the rear wall of the housing, such that an interference with the visual sensing apparatus 500 provided at the front wall of the housing can be avoided.

Consistent with the disclosure, the avionics system of the UAV can have the visual sensing apparatus 500 arranged at the front wall of the housing, such that the visual sensing apparatus 500 can obtain an optimal position to increase an angular range for the visual sensing apparatus 500 to capture images. Because the visual sensing apparatus 500 can be mounted at the front wall of the middle frame 103, the interferences of other structures of the UAV can be reduced, and hence, it is more convenient to perform maintenance on the visual sensing apparatus 500. When the visual sensing apparatus 500 includes the binocular camera 501 and the image transmission circuit 502, more image information can be obtained through the binocular camera 501, and real-time images can be transmitted to the ground receiving device, for example, a remote controller or a ground station, through the image transmission circuit 502. If the light indicator 503 is mounted in the front end of the image transmission circuit 502, an operator can directly observe whether the visual sensing apparatus 500 is working and whether the image transmission circuit 502 is transmitting image data, or the like, through the light indicator 503.

In some embodiments, the positioning circuit 300 can include a real-time kinematic (RTK) positioning circuit 301 and a global positioning system (GPS) positioning circuit 302. Relative positions between the RTK positioning circuit 301 and the GPS positioning circuit 302, and relative positions of the RTK positioning circuit 301 and the GPS positioning circuit 302 with the PCB 200 can be set according to actual requirements. Taking the avionics system of the UVA shown in FIG. 1 as an example, the PCB 200 can be fixed above the mounting board, and the RTK positioning circuit 301 and the GPS positioning circuit 302 can be provided below the mounting board at positions corresponding to the wireless communication circuit board 202. That is, the PTK positioning circuit 300 and the GPS positioning circuit 302 can be arranged at the lower enclosed space between the mounting plate and the lower cover 102. In some embodiments, the RTK positioning circuit 301 can be arranged above the GPS positioning circuit 302. During installation, the RTK positioning circuit 301 and the GPS positioning circuit 302 may be integrated together and fixed on the lower surface of the mounting plate or the inner wall of the lower cover 102.

Consistent with the disclosure, the avionics system of the UAV can improve the positioning accuracy of the UAV by using the RTK positioning circuit 301 and the GPS positioning circuit 302. In addition, the GPS positioning circuit can be arranged under the RTK positioning circuit 301 to make full use of the space in the housing to reduce the size of the avionics system of the UAV.

In some embodiments, the avionics system of the UAV can be mounted with at least one of an inertial sensing circuit 700 and antenna(s) 800. As shown in FIG. 1, the inertial sensing circuit 700 is mounted inside the housing, and a mounting position can be located below the RTK positioning circuit 301 to make full use of the space in the housing, thereby reducing the size of the UAV.

Two antenna 800 may be fixed on the left wall and the right wall of the housing. The antennas 800 can be communicatively connected to the wireless communication circuit board 202 through interfaces provided at the wireless communication circuit board 202. For example, mounting holes of the antennas 800 can be provided at the left and right walls of the housing, and the connectors of the antennas 800 can extend through the mounting holes of the antennas 800 into the enclosed space of the housing and can be coupled with the interfaces on the wireless communication circuit board 202 directly or through a wire harness. As such, the transmission and receive of wireless signals can be realized. In some embodiments, the antenna(s) 800 may also be fixed only at the left wall or the right wall of the housing.

As shown in FIGS. 1 and 3, the positions of the mounting holes for the antennas 800 on the left wall and the right wall of the housing can be staggered from the position of the PCB 200, such that the size of the avionics system of the UAV can be reduced.

In some embodiments, two antennas 800 can be mounted on each of the left wall and the right wall of the housing to improve the signal transmission and receive power of the antennas 800. The number of the antennas 800 mounted at the left wall and the right wall of the housing may be one or two or more.

Consistent with the disclosure, the inertial sensing circuit 700 can be mounted inside the housing of the avionics system of the UAV, such that the detection and measurement of UAV's acceleration, tilt, shock, vibration, rotation and multi-degree-of-freedom motion can be realized. When at least one of the left wall and the right wall of the housing is mounted with the antenna 800 communicatively connected with the wireless communication circuit board 202, the capability of wireless communication of the avionics system of the UAV can be improved.

In some embodiments, a fan 900 for cooling the housing can be provided at the outside of the housing. As shown in FIG. 1, the fan 900 is arranged above the housing, for example, the fan 900 can be fixed at a top surface of the upper cover 101 of the housing. In some embodiments, the housing may be made of metal, and a plurality of heat dissipation fins can be formed on the top surface of the upper cover 101 through extending in a length direction or a width direction, and hence, a heat dissipation air duct can be formed between two adjacent heat dissipation fins and air can flow inside the heat dissipation air duct. The heat emitted by the electronic components in the enclosed space of the housing can be transferred to the heat dissipation fins of the upper cover 101 of the housing, and then transferred to the air in the heat dissipation air duct. A rotation of the fan 900 mounted in the middle of the cooling fin can drive air to circulate between the cooling air duct and the external environment, thereby quickly taking away the heat on the cooling fin, so as to cool down the avionics system of the UAV.

The shape and number of the heat dissipation fins can be set according to actual requirements. For example, as shown in FIG. 1, the heat dissipation fins are arranged along the length direction, and the heat dissipation fins include a left part and a right part, and the fan 900 is fixed between the left part and the right part by bolts.

Consistent with the disclosure, the avionics system of the UAV can have the fan 900 mounted outside of the housing, such that the housing and the PCB 200 and the positioning circuit 300 mounted inside the housing can be cooled. As such, the stable and normal operation of the flight control circuit board 201, the wireless communication circuit board 202, and the positioning circuit 300 inside the housing can be ensured.

Figure 7:
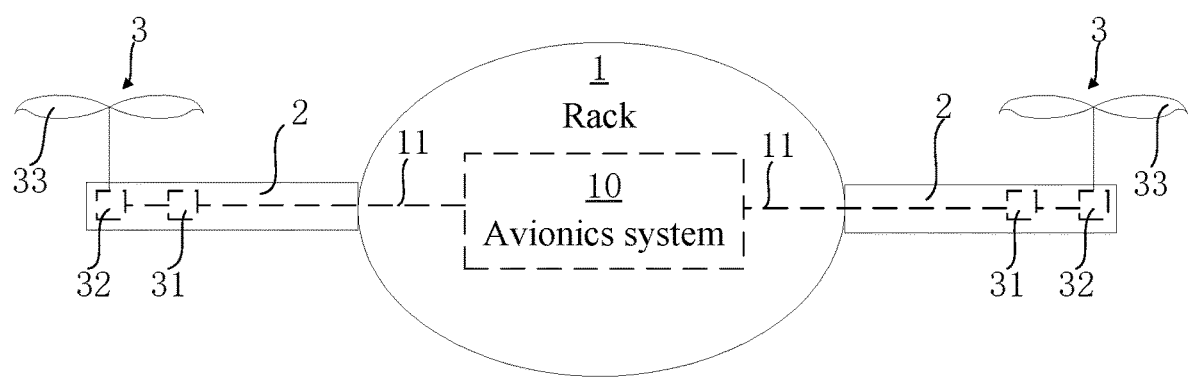
FIG. 7 is a schematic structural diagram of the UAV of FIG. 1 consistent with embodiments of the disclosure.

FIG. 7 is a schematic structural diagram of the UAV of FIG. 1 consistent with the disclosure. As shown in FIG. 7, the UAV includes a rack 1, power component(s) 3, and arm(s) 2 connecting the rack 1 and the power component(s) 3. An avionics system 10 of the UAV can be mounted at the rack 1. The avionics system 10 of the UAV may be any avionics system of the UAV described above. The structure, working principle, and beneficial effects of the avionic system 10 are similar to the avionics system of the UAV described above, and detail description are omitted herein.

The power assembly 3 includes an electronic governor 31, a motor 32 communicatively connected to the electronic governor 31, and a propeller 33 driven by the motor 32 to rotate. The electronic governor 31 is communicatively connected with the flight control circuit board in the avionics system 10 of the UAV through the connection wire 11, such that it can output a control signal to the motor 32 according to a command issued by the flight control circuit board to control the rotation speed, steering, and the like, of the motor 32. The electronic governor 31, the motor 32, and the propeller 33 may are similar to those in the prior art, and detail description are omitted herein.

Consistent with the disclosure, in the avionics system of the UAV, the flight control circuit board 201 and the wireless communication circuit board 202 can be integrated on the PCB 200, the PCB 200 and the positioning circuit 300 can be mounted inside the housing, and the connection wire 400 for connecting the flight control circuit board 201 and the electronic governor can pass through the mounting hole provided at the side wall of the housing. As such, the electronic governor, motor, and propeller can be isolated from the flight control circuit board 201, the wireless communication circuit board 202, and the positioning circuit 300, and thus, when the power component is working, the generated magnetic field change signal cannot be superimposed on the avionics system of the UAV. Therefore, the difficulty of subsequent filtering can be reduced, the information transmission reliability of the avionics system of the UAV can be improved, the performance of the UAV can be stabled, and the potential safety threat of the UAV can be reduced.

Furthermore, because the power component can be communicatively connected to the avionics system of the UAV through the connection wire 400, the weak electrical components and strong electrical components of the UAV can be isolated, thereby reducing conversions between the strong and weak powers and the number of isolation components of the avionics system. As a result, the amount of wiring harness of the avionics system of the UAV can be reduced, the wiring of the avionics system can become simple and easy, and the size of the avionics system of the UAV can be reduced. Manufacturing assembly, maintenance, or testing of the avionic system can be more convenient and simpler. The interference of complex lines on signal transmission can be reduced, the stability of the UAV can be improved, and the potential safety threat of the UAV can be reduced. The heat dissipation of the avionics system of the UAV can be also greatly reduced, such that the electronic components in the avionics system of the UAV can work withing a rated operating temperature, thereby improving the stability of the avionics system of the UAV.

It is intended that the disclosed embodiments be considered as exemplary only and not to limit the scope of the disclosure. Changes, modifications, alterations, and variations of the above-described embodiments may be made by those skilled in the art within the scope of the disclosure.

What is claimed is:

1. An avionics system for an unmanned aerial vehicle (UAV) comprising:
a housing having a mounting hole;
a flight control circuit board arranged inside the housing;
a wireless communication circuit board integrated with the flight control circuit board on a printed circuit board (PCB);
a positioning circuit arranged inside the housing and above or below the PCB;
a connection wire passing through the mounting hole and connecting the flight control circuit board with an electronic governor of the UAV arranged outside the housing; and
a visual sensing apparatus fixed at a front wall of the housing, the front wall of the housing facing a forward direction of the UAV, the visual sensing apparatus including a binocular camera and an image transmission circuit, and the image transmission circuit including an indicator light provided at a front end of the image transmission circuit and configured to indicate a working state of the image transmission circuit.

2. The system of claim 1, wherein two lenses of the binocular camera are arranged on two sides of the image transmission circuit.

3. The system of claim 1, further comprising:
a binocular mounting bracket configured to carry the visual sensing apparatus.

4. The system of claim 1, wherein the positioning circuit includes:
a global positioning system (GPS) positioning circuit; and
a real-time kinematic (RTK) positioning circuit arranged above the GPS positioning circuit.

5. The system of claim 4, wherein the RTK positioning circuit is arranged below the PCB.

6. The system of claim 4, further comprising:
an inertial sensing circuit arranged inside the housing and below the RTK positioning circuit.

7. The system of claim 1, further comprising:
one or more antennas fixed on at least one of a left wall or a right wall of the housing, and communicatively connected to the wireless communication circuit board through one or more interfaces provided at the wireless communication circuit board.

8. The system of claim 1, wherein the mounting hole is provided at a rear wall of the housing.

9. The system of claim 1, wherein:
the connection wire includes a pin plug or a pin socket; and
the PCB includes a corresponding pin socket or a pin plug corresponding to the pin plug or the pin socket of the connection wire.

10. The system of claim 1, further comprising:
a fan arranged outside the housing and configured to cool the housing.

11. The system of claim 10, wherein the fan is arranged at a top surface of the housing.

12. The system of claim 1, wherein the housing includes:
an upper cover; and
a lower cover, the upper cover and the lower cover together enclosing a space for mounting the PCB and the positioning circuit.

13. The system of claim 12, wherein:
the housing further includes a middle frame;
the upper cover covers an upper opening of the middle frame;
the lower cover covers a lower opening of the middle frame; and
the PCB and the positioning circuit are fixed at the middle frame.

14. The system of claim 13, wherein:
the upper cover and the middle frame enclose to form an upper space accommodating the PCB; and
the lower cover and the middle frame enclose to form a lower space accommodating the positioning circuit.

15. The system of claim 12, further comprising:
a sealing ring inside the housing.

16. The system of claim 1, further comprising:
a fan mounted to a top surface of the housing and configured to cool the housing; and
a plurality of heat dissipating fins formed on the top surface of the housing and surrounding the fan.

* * * * *